(12) United States Patent
Bina et al.

(10) Patent No.: US 10,468,148 B2
(45) Date of Patent: Nov. 5, 2019

(54) APPARATUS AND METHOD FOR NEUTRON TRANSMUTATION DOPING OF SEMICONDUCTOR WAFERS

(71) Applicant: Infineon Technologies AG, Neubiberg (DE)

(72) Inventors: Markus Bina, Sauerlach (DE); Hans-Joachim Schulze, Taufkirchen (DE); Werner Schustereder, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 80 days.

(21) Appl. No.: 15/494,599

(22) Filed: Apr. 24, 2017

(65) Prior Publication Data

US 2018/0308698 A1 Oct. 25, 2018

(51) Int. Cl.
| | | |
|---|---|---|
| *G21G 1/06* | (2006.01) | |
| *C30B 31/20* | (2006.01) | |
| *H01L 21/261* | (2006.01) | |
| *G21G 4/02* | (2006.01) | |

(52) U.S. Cl.
CPC ............... *G21G 1/06* (2013.01); *C30B 31/20* (2013.01); *H01L 21/261* (2013.01); *G21G 4/02* (2013.01)

(58) Field of Classification Search
CPC .......... H01L 21/261; G21G 1/06; G21G 4/02; C30B 31/20
USPC ......................................................... 376/183
See application file for complete search history.

(56) References Cited

U.S. PATENT DOCUMENTS

| | | | | |
|---|---|---|---|---|
| 3,349,001 | A * | 10/1967 | Stanton | G21C 1/30 376/171 |
| 5,904,767 | A | 5/1999 | Liao | |
| 6,028,329 | A * | 2/2000 | Liao | H01L 21/261 257/197 |
| 2003/0152187 | A1 | 8/2003 | Ritter | |
| 2005/0082469 | A1* | 4/2005 | Carlo | G21G 1/06 376/158 |
| 2009/0233427 | A1 | 9/2009 | Sasaki et al. | |

(Continued)

FOREIGN PATENT DOCUMENTS

| | | |
|---|---|---|
| JP | H10112441 A | 4/1998 |
| JP | 2004514242 A | 5/2004 |

(Continued)

OTHER PUBLICATIONS

International Atomic Energy Agency, "Neutron Transmutation Doping of Silicon at Research Reactors", May 2012, IAEA-TECDOC-1681, IAEA, Vienna, Austria.

(Continued)

*Primary Examiner* — Sharon M Davis
(74) *Attorney, Agent, or Firm* — Viering, Jentschura & Partner MBB

(57) ABSTRACT

In various embodiments, a method of processing one or more semiconductor wafers is provided. The method includes positioning the one or more semiconductor wafers in an irradiation chamber, generating a neutron flux in a spallation chamber coupled to the irradiation chamber, moderating the neutron flux to produce a thermal neutron flux, and exposing the one or more semiconductor wafers to the thermal neutron flux to thereby induce the creation of dopant atoms in the one or more semiconductor wafers.

19 Claims, 6 Drawing Sheets

(56) References Cited

U.S. PATENT DOCUMENTS

| | | | | |
|---|---|---|---|---|
| 2015/0050754 A1* | 2/2015 | Ploss | ............... | H01L 21/261 |
| | | | | 438/10 |
| 2015/0371858 A1* | 12/2015 | Laven | ............... | H01L 29/66712 |
| | | | | 438/530 |
| 2016/0172065 A1* | 6/2016 | Labaune | ............... | G21G 1/06 |
| | | | | 376/190 |

FOREIGN PATENT DOCUMENTS

| | | |
|---|---|---|
| JP | 2012103260 A | 5/2012 |
| JP | 2019504817 A | 2/2019 |
| WO | 2008059827 A1 | 3/2010 |
| WO | 2016007588 A1 | 1/2016 |
| WO | 2017137438 A1 | 8/2017 |

OTHER PUBLICATIONS

Fujio Hiraga et al., "Neutronic Design on a Small Accelerator based 7Li (p, n) Neutron Source for Neutron Scattering Experiments", Aug. 16, 2010, pp. 1-30.

Masao Murakami et al., "Radiotherapy using a laser proton accelerator", International Symposium on Laser-Driven Relativistic Plasmas Applied Science, Sep. 17-20, 2007, 26 pages, Kyoto, Japan.

C. L. Lee et al., "Thick target neutron yields for the 7Li(p,n)7Be reaction near threshold", Nuclear Instruments and Methods in Physics Research Section B, Apr. 1999, pp. 1-11, vol. 152, Issue 1, Elsevier Science B.V.

* cited by examiner

APPARATUS AND METHOD FOR NEUTRON TRANSMUTATION DOPING OF SEMICONDUCTOR WAFERS

TECHNICAL FIELD

The present disclosure relates generally to an apparatus and method for doping semiconductor material based on the nuclear transmutation process.

BACKGROUND

In the production of semiconductor components, it is necessary to be able to set the electrical conductivity of the semiconductor material as precisely as possible according to the desired purpose of the semiconductor components. Semiconductor material for power electronics especially requires unique material characteristics because of the high blocking capability of semiconductor material and the high currents flowing in the semiconductor material. Semiconductor material with non-uniform electrical properties may render the power devices unstable and potentially dangerous.

The electrical characteristics of a semiconductor material are set by doping it with suitable impurity atoms. For power devices to work at designated power levels and voltage readings it is necessary to dope the semiconductor material with impurities that enable sufficient blocking capability and homogeneous current flow through the bulk of the semiconductor material. One effective and accurate doping technique used for high power semiconductor material is the Neutron Transmutation Doping (NTD) process. The conventional NTD process is implemented by irradiating semiconductor ingot rods in a nuclear reactor with neutrons of suitable energy for a suitable time period.

Silicon is by far the most common semiconductor material used for power semiconductor devices today. As applied to silicon, the conventional NTD process provides effective doping control and removal of non-uniformities in high resistivity silicon crystal. When silicon material is exposed to thermal neutron irradiation, phosphorous dopant atoms are induced within the silicon material thereby changing the resistivity of the silicon material. Specifically, when a neutron collides and merges with a $^{30}$Si isotope, an unstable $^{31}$Si isotope is formed, which subsequently transmutes to a $^{31}$P atom by beta decay, resulting in n type impurity doping in the silicon material.

However, since the neutrons are absorbed in the silicon, the conventional NTD process results in an undesired radial gradient of the resulting n-doping, which results in a lateral variation of the electrical characteristics of the power semiconductor devices manufactured from the silicon ingot rod. In order to minimize this effect of inhomogeneity, the silicon ingot rods can, for example, be rotated in the nuclear reactor, so that the neutron irradiation is performed from all sides of the silicon ingot rod. However, despite such measures substantial lateral variations still occur in silicon ingot rods having a diameter of about for example 300 mm or larger due to the above described absorption effects. Lateral doping uniformity of ingot rods having a diameter of about 300 mm or greater has been a challenge using conventional NTD.

Further, the conventional NTD process is implemented with a nuclear reactor which is undesirable. It is difficult to adapt existing nuclear reactors to accommodate larger diameter semiconductor ingots. For example, ingots having a diameter larger than about 200 mm cannot be irradiated in many existing nuclear reactors.

SUMMARY

In various embodiments, a method of processing one or more semiconductor wafers is provided. The method includes positioning the one or more semiconductor wafers in an irradiation chamber, generating a neutron flux in a spallation chamber coupled to the irradiation chamber, moderating the neutron flux to produce a thermal neutron flux, and exposing the one or more semiconductor wafers to the thermal neutron flux to thereby induce the creation of dopant atoms in the one or more semiconductor wafers.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Various embodiments of the invention are explained in greater detail below, with reference to the accompanying figures. However, the invention is not restricted to the embodiments specifically described, but rather can be more suitably modified and altered. It lies within the scope of the invention to combine individual features and feature combinations of one embodiment with features and feature combinations of another embodiment in order to arrive at further embodiments according to the invention.

Identical elements are provided with the same or similar reference signs in the figures. A repeated description of these elements has been dispensed with in order to avoid repetition.

The basic principle presented here will be elucidated on the basis of the examples given below.

In accordance with various embodiments, semiconductor ingots having a large diameter (e.g., ranging from about 300 mm to about 1,000 mm) can achieve a homogenous and reproducible doping. In various embodiments, a semiconductor ingot having a diameter of about 300 mm or greater may be processed into a plurality of semiconductor wafers each having an area greater than about 70,685 mm$^2$, a doping in the region of n doping below 2×10$^{13}$ cm$^{-3}$ can be achieved. This doping level is interesting e.g. for high-voltage components. Typical fields of application would be for example high blocking insulated gate bipolar transistors (IGBTs) or diodes.

Figure 1:
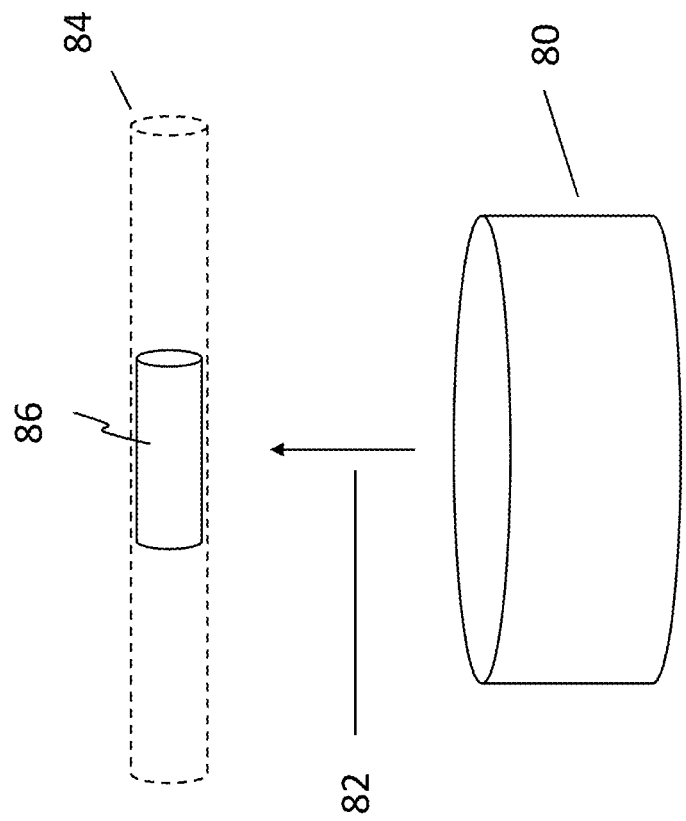
FIG. 1 illustrates a typical configuration for a conventional NTD process.

FIG. 1 illustrates a typical configuration for an NTD process. Referring to FIG. 1, an NTD reactor 1 includes a nuclear reactor 80 that provides thermal neutron flux 82 directed upwards or sidewards from the nuclear reactor 80 and a rotating tube 84 disposed over the nuclear reactor 80. An undoped silicon ingot rod 86 is loaded into the rotating tube 84 and positioned so that it is in the thermal neutron flux 82. The central axis of the silicon ingot rod 86 may be perpendicular to the direction of the thermal neutron flux 82. The duration of irradiation is determined based on the power of the nuclear reactor 80 and the initial and target ingot resistivity. However, due to the neutron absorption effect of silicon, the NTD process is usually more suitable for cylindrical ingot rods having a diameter less than or equal to about 200 mm.

In various embodiments, a proton beam generator and a neutron producing material may be used instead of a nuclear reactor to generate neutrons that can be used for the NTD process. Nuclear spallation is one of the processes by which a particle accelerator may be used to produce a beam of neutrons. For example, a neutron producing material may be a material that can undergo a spallation when bombarded by energetic particles. In nuclear spallation, neutrons are generated through the spallation of nuclei by charged particles such as protons accelerated by a particle accelerator. Neutrons may be emitted when a spallation target composed of material such as boron-compounds, lithium, tungsten, tantalum, uranium, or compounds and alloys thereof is struck with protons with an energy of 100 keV up to about 1 GeV, depending on the spallation target material. For example, neutrons are emitted when a spallation target composed of a material such as lithium or boron nitride is struck with protons with an energy in the range from 1 MeV up to about 10 MeV. A particle accelerator such as a proton or ion implanter commonly used in the manufacturing of semiconductor devices may be used to irradiate such a target with highly energetic protons to thereby generate a well-defined neutron flow. Neutron yield data of the neutron producing material versus incident energy are necessary in order to select the proper incident energy and irradiation time and for estimating the intensity and duration of the incident proton current.

Figure 2:
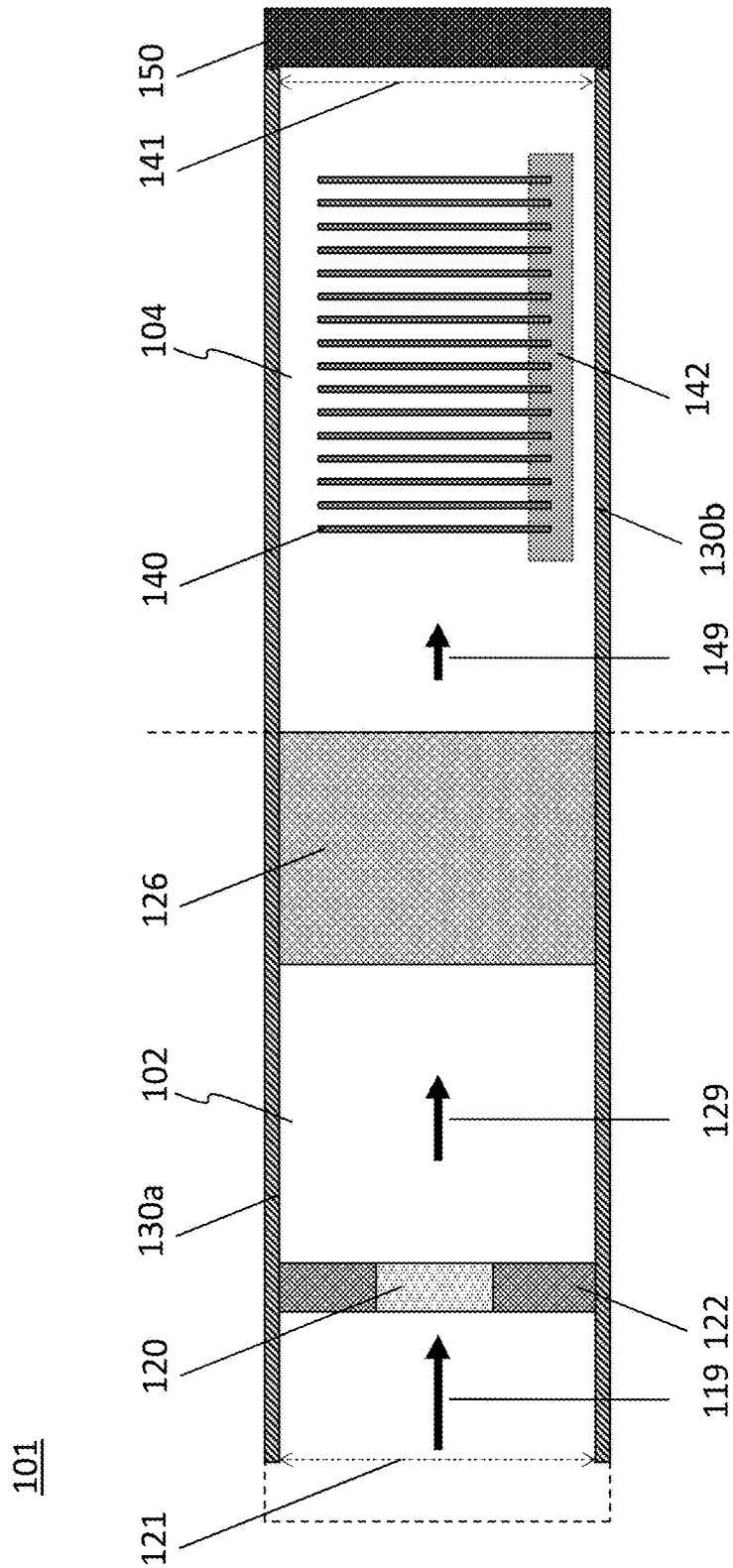
FIG. 2 illustrates a cross-sectional side view of a non-nuclear NTD reactor in accordance with at least one embodiment.

FIG. 2 illustrates a cross-sectional view of a non-nuclear NTD reactor 101 in accordance with at least one embodiment. Referring to FIG. 2, the reactor 101 may include a proton beam generator 110 (not shown) configured to emit a proton beam to a neutron generation chamber 102 which is coupled to an irradiation chamber 104. The neutron generation chamber 102 may include an aperture 121 followed by a neutron producing target 120 mounted on a target mount 122 which is followed by a neutron moderator 126. The proton beam generator 110 is configured so that an emitted proton beam enters the aperture 121 to strike the neutron producing target 120. The irradiation chamber 104 is configured to house one or preferentially more semiconductor wafers 140 rather than a semiconductor ingot. The irradiation chamber 104 includes an aperture 141 which can be sealed by chamber door 150. In various embodiments, the one or more semiconductor wafers 140 are held upright on a removable wafer rack 142.

Operationally, referring to FIG. 2, the proton beam generator 110 emits an ion or proton beam 119 that interacts with the neutron producing target 120 to generate a flow of neutrons 129 including "hot" neutrons, above the thermal energy range. The flow of neutrons 129 is guided to the neutron moderator 126 which reduces the thermal energy of the neutrons as they pass through the neutron moderator. The flow of moderated neutrons which is composed substantially of "cold" neutrons in the thermal energy range, i.e., thermal neutrons 149, is used to irradiate the one or more semiconductor wafers 140 housed in the irradiation chamber 104.

Referring to FIG. 2, the proton beam generator 110 may be a conventional proton or ion implanter which can provide proton (H+) beam current currents (i.e., dose rate), for example in the range from about 1 mA to a about 100 mA and provide implantation energies (i.e., acceleration voltage) in the region up to about 10 MeV, for example, in the range from about 2 MeV to about 10 MeV. The beam current may be limited by the thermal energy input of the neutron producing target. In various embodiments, the acceleration voltage may be about 2 MeV. In various embodiment, the acceleration voltage may be less than or equal to about 4 MeV. In various embodiments, a proton-implanter in a parameter region of up to about 5 MeV and about 0.5 mA may be used. The proton beam current and the irradiation energy are key parameters for an accelerator useful for a NTD reaction. The target area may be determined by the spot size of the proton beam. The approximate spot size of a typical ion implanter is in the order of 1 to several $cm^2$, however systems with ion beams as broad as the irradiated target can also be achieved.

In various embodiments, a proton beam may be generated by a high current H+ implanter. For example, a high current H+ implanter may generate proton energies up to about 2 MeV and beam currents up to about 100 mA. A corresponding upscaling of the energy is technically possible. In various embodiments, a proton implanter having the capability to implant an inhomogeneous dose in a targeted radial manner may also be used. This capability could be used e.g. in case effects of different dopings would be desired in a targeted manner.

Referring to FIG. 2, the proton beam generator 110 emits a proton beam 119 that may interact with the neutron producing target 120 to create a flow of neutrons 129 through various (p,n) type reactions or similar types of reactions. In various embodiments, a neutron flow of approximately $1e12\ cm^{-2}s^{-1}$ should be generated. Thus, the target material selected should allow a high-efficiency generation of neutrons. For example, such a target material may be lithium, lithium/carbon mixture, tungsten, or boron and boron compounds (for example boron nitride).

The neutron producing target 120 may be in the form of a circular disc or it may be provided in any other shape, including rectangular, elliptical, conical, toroidal, etc. The neutron producing material of the neutron producing target 120 may be in solid phase or be in liquid phase pumped through a target chamber made of steel. The thickness of the neutron producing target material should be sufficient to slow protons past the reaction threshold.

For example, in various embodiments, a beam of protons may be used to bombard a thick lithium-7 target to generate neutrons via the $^7Li(p,n)^7Be$ reaction. The lithium-7 target may be a circular puck of lithium-7 in a solid phase that is approximately 1 mm thick and having a diameter of at least 1 $cm^2$ The neutron yield is dependent on the proton beam current density. The neutron yield between the $^7Li$ target and the neutron moderator 126 should be approximately $1e11\ n/cm^2/mA$. This would correspond to a $1e12\ n/cm^2s$ neutron flow when a 10 mA proton beam is used and a $1e13\ n/cm^2s$ neutron flow when a 100 mA proton beam is used. The neutron yield at the wafers for a 100 mA proton current may range from about 2e12/cm²s and 6e12/cm²s. The actual neutron yield may further depend on various factors including the design of the irradiation chamber and the proton implanter.

Figure 4:
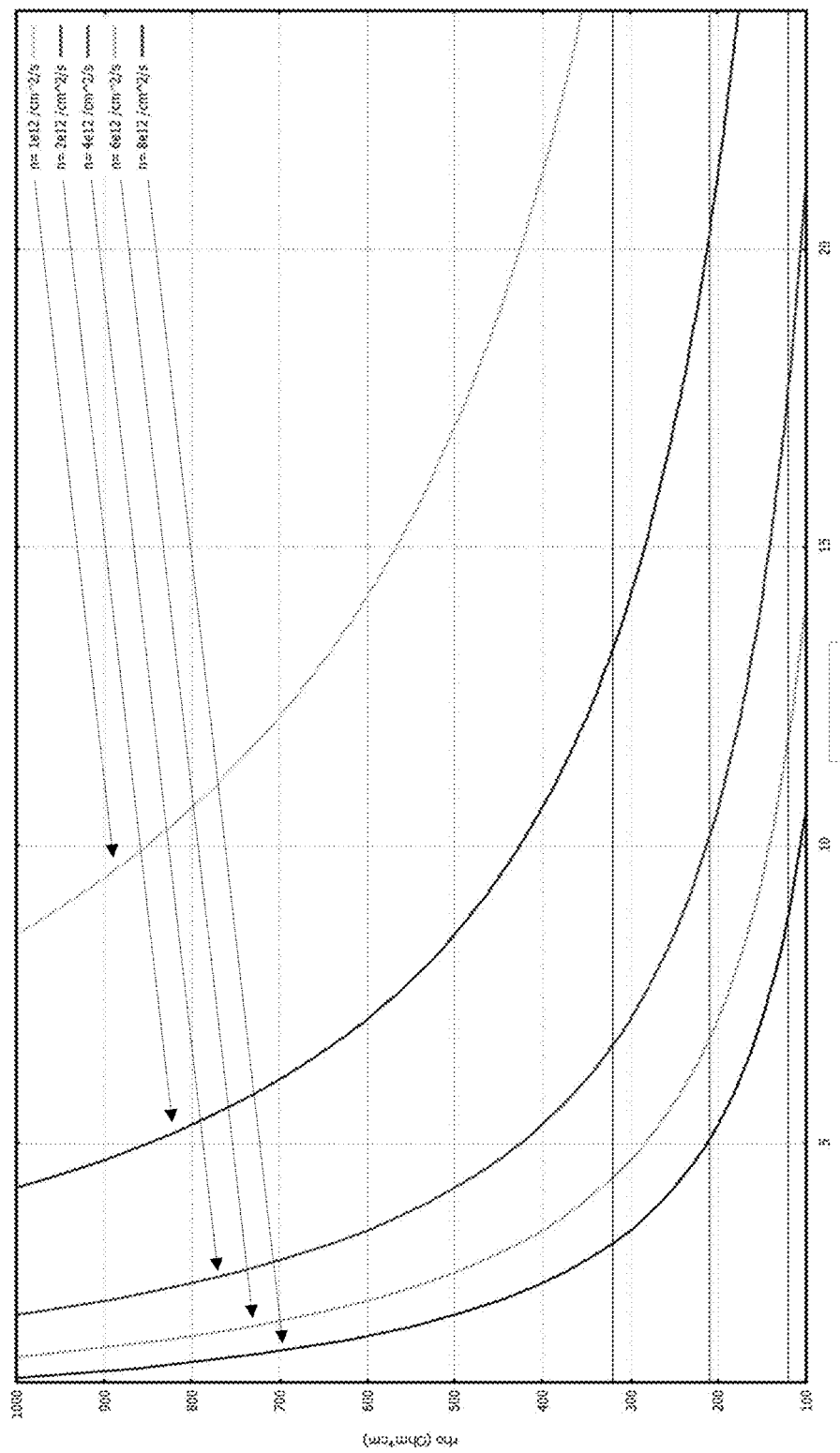
FIG. 4 is a graph illustrating the basic ohmic characteristic of an initially undoped wafer dependent on the irradiation period for various neutron flows.

FIG. 4 is a graph showing the basic ohmic characteristic of an initially undoped wafer dependent on the irradiation period for various neutron flows. In the semiconductor industry, the resistivity rather than the dopant concentration is usually used. Therefore, the relationship between the resistivity and the dopant concentration should be established first.

For n type silicon doping, the resistivity (Ωcm) is given by $$\rho = \frac{1}{[D]\mu\varepsilon}$$

where [D] is the dopant atomic concentration in cm$^{-3}$, $\varepsilon$ is the electron charge, $1.602\times10^{-19}$ C, and $\mu$ is the drift mobility of the electrons in the silicon crystal lattice. Electron mobility depends on the temperature, and it may be in the range of 1220~1500 cm²/V·s. In normal conditions at 300 K, it should be usually 1350 cm²/V·s for silicon.

As shown in FIG. 4, the use of a higher power proton beam may reduce the irradiation period. However, this may also increase the temperature in the active target area of the neutron producing target. For example, a proton beam of about 2 MeV at about 100 mA may heat the active target area on the order of about 100 kW/cm². The efficient removal of heat from the active target area may be a limiting factor on the intensity of the proton beam and the duration of the irradiation period.

Due to the high energy input of the protons, the neutron producing target 120 should to be cooled effectively. Up to 500 kW/cm³/mA of thermal energy may need to be discharged from neutron producing target 120. This is due to the correspondingly small input cross section for the targeted proton reaction. Therefore, the neutron producing target 120 should have a good heat conductivity and/or should be correspondingly cooled.

The target mount 122 is configured such that it allows an efficient cooling of the neutron producing target 120. The cooling should be performed so that the neutrons produced by the neutron producing target 120 are not absorbed. In various embodiments, the target mount 122 may include a copper plate for cooling. Alternatively, a target mount 122 may include a liquid coolant. For example, in various embodiments, heavy water (D$_2$O) may be used and configured for injection cooling. Heavy water is an effective coolant with a minimal absorption coefficient, i.e., heavy water is not likely to absorb neutrons. Additionally, heavy water is a good moderating material. In various embodiments, depending on the target material the liquid coolant may be a liquid metal.

The uniformity of coverage of the generated neutron flux is another aspect in the NTD reaction. For example, in the NTD of silicon, the induced $^{31}$P concentration is proportional to the irradiated neutron fluence, which is a product of the neutron flux, time of irradiation with a constant neutron flux, and the reaction cross-section. As the neutron cross-section varies by neutron energy, it is influenced from the neutron spectrum in the irradiation site.

Figure 6A:
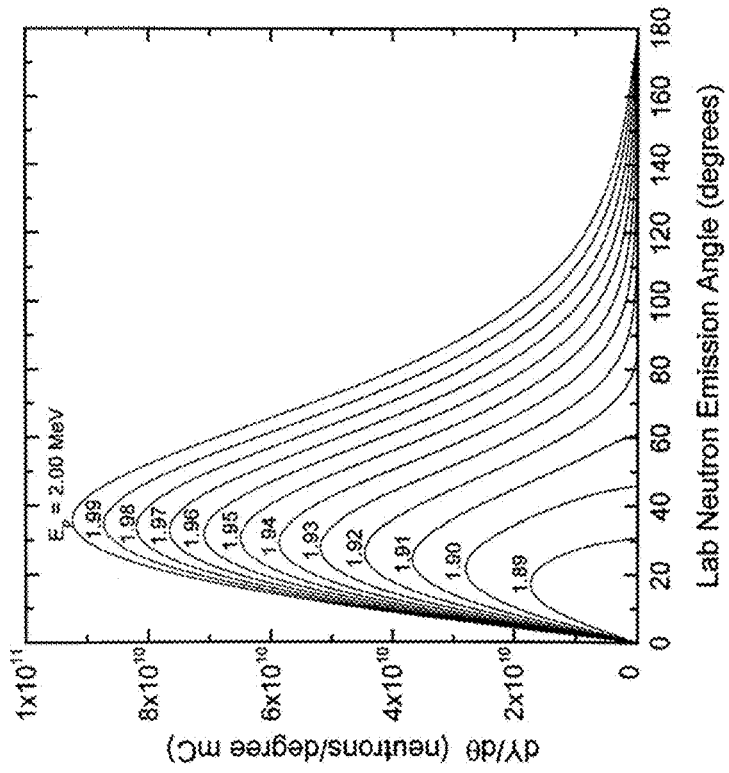
FIGS. 6A-B are graphs illustrating the neutron energy spectra and angular distribution for a lithium target.
Figure 6B:
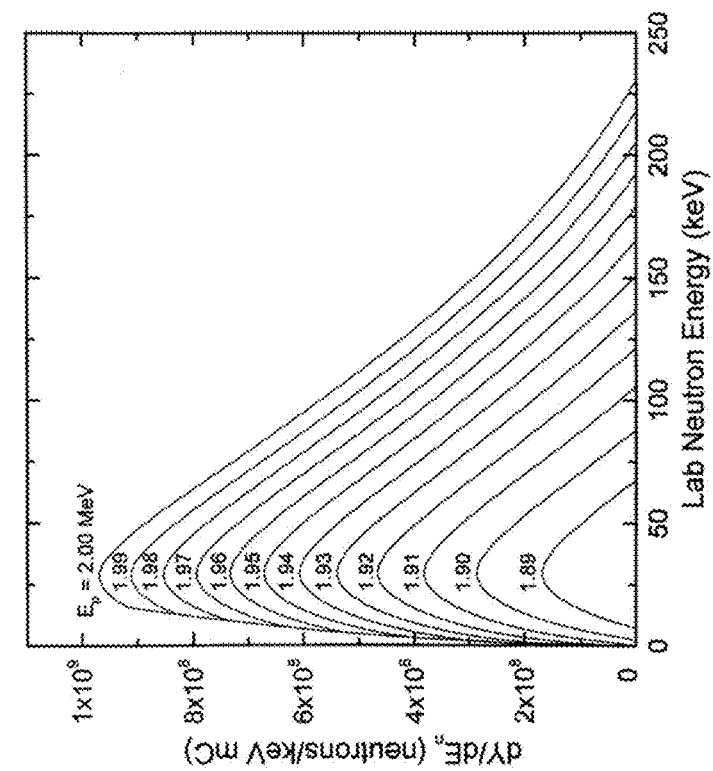

The energy spectra and angular distribution of the generated neutron flow is dependent on the incident beam energy of the proton beam, the incident angle of the proton beam, and the space angle behind the neutron producing target 120. As the protons lose energy traveling through the neutron producing target, the energy spectra and angular distribution of the neutrons generated change. For example, FIGS. 6A and 6B show a distribution of the energy spectrum and the emission angles of the neutron yield for a proton beam striking a lithium target at an incidence angle of 0° for various incident beam energies. Consequently, the irradiation of the neutron producing target 120 with protons should be carried out such that the neutron flow is distributed homogeneously over the cross sectional areas of the neutron generation chamber 2 and the irradiation chamber 104.

In various embodiments, homogeneity is determined by the uniformity of the neutron flux in the irradiation chamber over the volume of the plurality of wafers and by the purity of the grown crystals. Neutron fluence monitors may be installed in the irradiation chamber to monitor neutron spectra and cross sectional reaction area. This information may be used to reconfigure the NTP reactor to achieve a desired doping.

In various embodiments, the proton beam may be configured to scan or trace a pattern over the neutron producing target 120. This may homogenize the neutron flux depending on the material of the neutron producing target 120. This may also minimize local heating of the neutron producing target 120. Alternatively, the target mount 122 may be adjustable. In various embodiments, the target mount 122 may be configured to modify the position of the neutron producing target 120 to achieve a homogeneous distribution of the neutron flow or to minimize local heating of the neutron producing target 120.

The angular distribution of the neutron flow may also be dependent on the reflectivity of the walls of the chambers so that stray neutrons striking the walls are redirected towards the irradiation chamber 104. The walls 130a and 130b of the neutron generation chamber 102 and the irradiation chamber 104 act as neutron guides and are made of material which is suitable as a neutron reflector. For example, beryllium, tungsten, nickel, steel, graphite, or other suitable chemical compounds may be used.

Referring to FIG. 2, the inner walls 130a and 130b of the neutron generation chamber 102 and the irradiation chamber 104 should act as neutron guides to guide the flow of neutrons from the neutron producing target 120 to the one or more wafers 140 in the irradiation chamber 104. The inner walls 130a and 130b may be made of a neutron reflecting material. For example, a neutron reflecting material may include solids, such as beryllium, carbon, steel, or silicon, with polished surfaces. As another example, a neutron reflecting material may be a neutron mirror including a layer of nickel, titanium, silicon, or nickel/titanium alloy on a substrate of glass or steel. As another example, a neutron reflecting material may be a neutron multilayer mirror or neutron supermirror. The thickness of the chamber walls depend on the reflecting material that is used to construct the chambers.

In various embodiments, the walls 130a and 130b of the neutron generation chamber and irradiation chamber may be manufactured from a solid cylindrical block of beryllium having a bore through the center of the block. The diameter of the bore may be slightly greater than the diameter of the semiconductor wafers. For example, in in various embodiment, the diameter of the bores may be about 500 mm which is large enough to accommodate semiconductor wafers that have a diameter of about 450 mm or less. The length of the block of beryllium may be about 120 cm. The thickness of these beryllium reflector walls may be about 60 cm.

The generated neutrons may be classified according to their energies as thermal (En<0.5 eV), epithermal (0.5 eV<En<10 keV), or fast (En>10 keV) neutrons. A neutron producing target 120 may generate a flow of neutrons including epithermal and fast neutrons. For example, the energy of the neutrons emitted from a lithium target may have a neutron flux spectra be in the range from about 25 keV to about 100 keV. Thermal neutrons are required to initiate the neutron capture that triggers the NTD reaction and epithermal and fast neutrons may damage the wafers. The epithermal and fast neutrons (i.e., "hot" neutrons) may be cooled to thermal neutrons (i.e., "cold" neutrons) by means of a moderating material before they are used to irradiate semiconductor wafers.

The neutron moderator 126 receives a flow of neutrons 129 including epithermal neutrons and/or fast neutrons from the neutron producing target 120 and outputs a flow of thermal neutrons 149 to the one or more wafers 140 by reducing the energy of neutrons passing through it. As epithermal neutrons and fast neutrons travel through the neutron moderator, they lose energy and fall into the thermal range through repeated collisions with the moderating material. The neutron moderating material may be solid, liquid (with suitable chamber), or gaseous (with suitable chamber). The material used as the moderator should result in a moderation (i.e., reduces neutron energy via elastic scattering) without any substantial absorption of neutrons.

Various material may be suitable as moderating material. A moderating material should have low neutron absorption, high neutron moderation, and low reflectivity to maximize the number of neutrons that reach the semiconductor wafers. Heavy water ($D_2O$) is very effective as a moderator. Carbon or carbon compounds (e.g., methan) may also be suitable as a moderator. The volume (width, thickness, height) of the neutron moderator 126 may be calculated by means of the corresponding elastic scattering cross sections (or Fermi-age).

Referring to FIG. 2, in various embodiments, the neutron moderator 126 may be made of carbon having a thickness of 30 cm and a diameter that is larger than the diameter of the neutron generation chamber 102. In order for the neutron moderator 126 to cool neutrons effectively, it has to be maintained at room temperature.

The flow of thermal neutrons 149 is guided to the irradiation chamber 104 coupled to the neutron generation chamber 102. The direction of the thermal neutron flux in the irradiation chamber is along the axial direction of the irradiation chamber. The irradiation chamber 104 houses one or more semiconductor wafers 140 to be irradiated. The one or more semiconductor wafers may be arranged so that the top and bottom surfaces of each wafer is perpendicular to the direction of the thermal neutron flux and axially aligned with the irradiation chamber.

In various embodiments, the number of semiconductor wafers 140 housed in the irradiation chamber 104 may range from about 10 wafers to about 100 wafers. The number of semiconductor wafers that may be simultaneously irradiated may be calculated based on the thickness $d_w$ of a wafer. In a conventional NTD reactor, a 200 mm diameter silicon ingot may be irradiated in a radial direction without significant risk of absorption effects for the case that the wafer is rotated during the irradiation. Thus, for example, assuming 100 mm as a maximum distance between the first and last silicon wafers and a silicon wafer thickness of 750 μm, 100 mm/$d_w$ silicon wafers, i.e., more than 100 silicon wafers, can be simultaneously irradiated in the irradiation chamber.

In various embodiments, the semiconductor wafers may be arranged on a wafer rack that is placed into an irradiation chamber. The wafer rack may be removable and the irradiation chamber may include a slide and rail assembly for mounting a removable wafer rack.

In various embodiments, the irradiation chamber 104 is maintained in a clean room environment in order to reduce environmental pollutants that may interact with the semiconductor material of the wafers.

Referring to FIG. 2, in various embodiments, the chamber door 150 is configured to provide repeated access to the irradiation chamber 104. It may be made of various layers of neutron absorbers. The construction of chamber door 150 should be in compliance with the valid laws. For example, in various embodiments, the chamber door 150 may include three layers. Materials suitable as a first layer may include boron and its compounds thereof, paraffin wax, and water (very good absorber). A material suitable as a second layer may be lead. A material suitable as a third layer may be ferro concrete, which may also serve as structural support.

Figure 5:
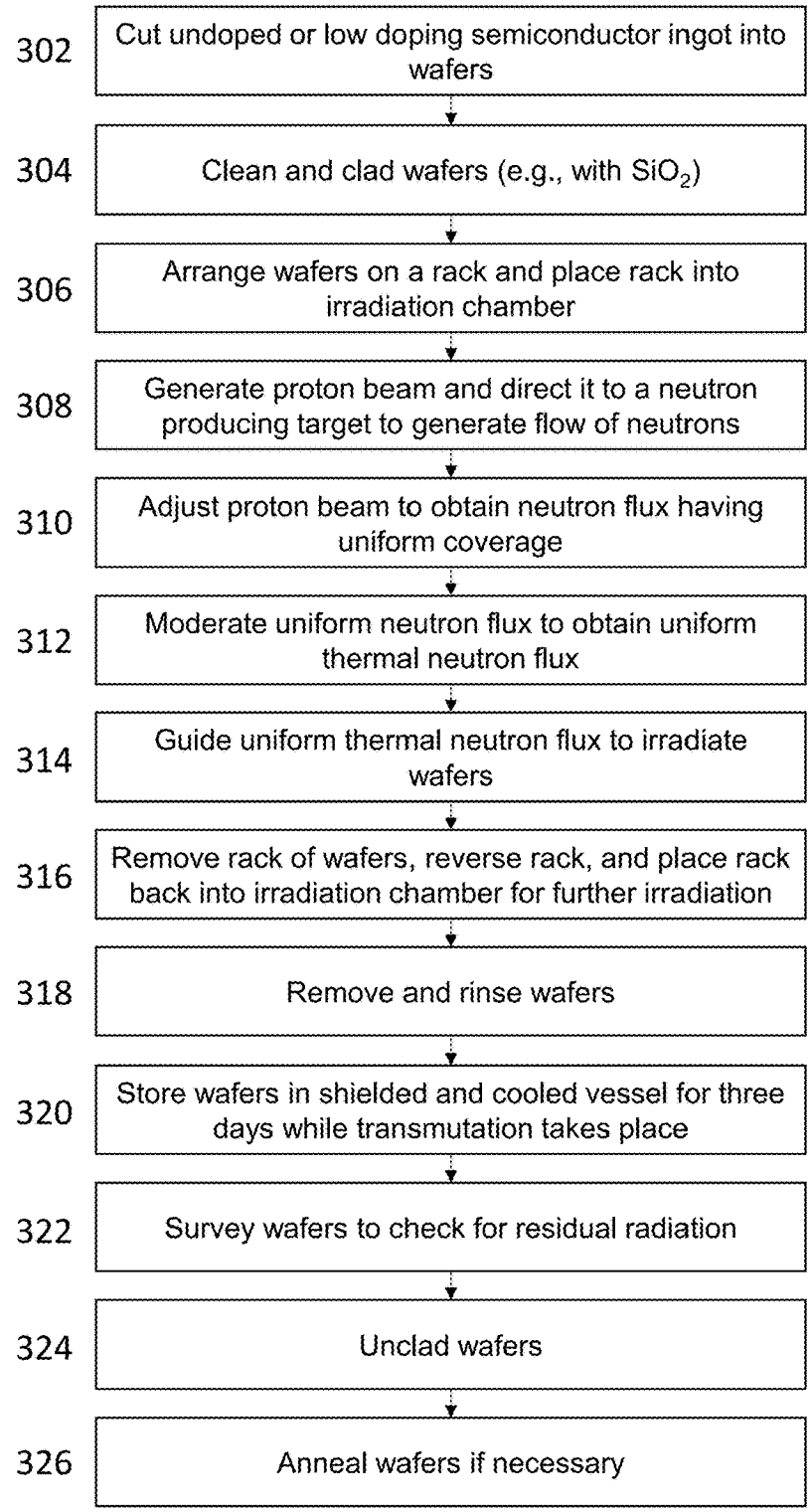
FIG. 5 is a flow chart of a method that provides uniform doping in large diameter semiconductor wafers in accordance with at least one embodiment.

FIG. 5 illustrates a flow chart of a method 300 for providing uniform doping of semiconductor wafers having large diameters in accordance with at least one embodiment. This homogeneous doping procedure results in a scattering of the doping level across the wafer which is less than 8%. In other embodiments, it may be less than 5% or less than 3% or even less than 2%. Referring to FIG. 5, at step 302 one or more semiconductor wafers are cut from a semiconductor ingot that is undoped or that has low doping. In other embodiments, the semiconductor ingot may be cut into logs having a length for example of about 100 mm for irradiation in the chamber and the logs are processed into wafers after the NTP process. At step 304, the semiconductor wafers are cleaned and cladded with an oxide. For example, silicon wafers may be cleaned and cladded with silicon dioxide ($SiO_2$) or just cleaned using state of the art silicon wafer cleaning technology.

At step 306, the semiconductor wafers are arranged in the irradiation chamber. The semiconductor wafers may be positioned so that the centers of the wafers are axially aligned with each other and the faces of the semiconductor wafers are perpendicular to the direction of neutron flow. The semiconductor wafers for example may be evenly spaced from each other. The space between each wafer should be large enough to allow the loading and unloading of the wafers without scratching a neighboring wafer, yet should be small enough to minimize contamination by atmospheric impurities. The distance between the neutron producing target and the wafer to be irradiated may be variably configured depending on the requirements of the processing, however, it should usually be as low as possible in order to ensure a shortest possible process duration.

At step 308, a proton beam is generated and is directed to a neutron producing target to generate a flow of neutrons, i.e., neutron flux, in a direction towards the irradiation chamber. At step 310, the incident angle and/or energy of the proton beam may be adjusted to obtain a neutron flux having uniform coverage in the neutron generation chamber and the irradiation chamber. The adjustment may be made based on the diameter of irradiation chamber since the uniform coverage may depend on a cross-sectional area of the irradiation chamber. At step 312, the neutron flux passes through a neutron moderator which moderates the epithermal and fast neutrons in the neutron flux to obtain a thermal neutron flux.

At step 314, the thermal neutron flux having uniform coverage is guided to the irradiation chamber. The direction of the thermal neutron flux in the irradiation chamber is along the axial direction of the irradiation chamber. The wafers are irradiated for a suitable period. For example, in various embodiments including a lithium target and silicon wafers, the irradiation time should be approximately 10 hours at 1e12 n/cm²s to achieve a resistivity of 60 Ωcm Si.

At step 316, to ensure a more homogeneous distribution of the irradiation from wafer to wafer or to increase the number of wafers to be irradiated, the wafer rack may be removed from the irradiation chamber at the end of the first half of the irradiation period, reversed front to back, and then placed back in the irradiation chamber for the second half of the irradiation period. Thus, the wafers that were closer to the neutron moderator become closer to the chamber door, and vice versa. At step 318, at the end of the irradiation period, the one or more wafers are removed and rinsed. At step 320, the irradiated wafers are stored so that the irradiated semiconductor material has time to undergo the transmutation nuclear reaction that produces the dopant atoms. Since this nuclear reaction produces gamma radiation, the irradiated wafers are stored in a cooled and shielded chamber. The chamber may be a double walled steel vessel filled with chilled water. The storage time depends on the semiconductor material and the half-life of the NTD reaction producing the dopant atoms. For silicon semiconductor material, the nuclear conversion producing phosphorous dopant atoms has a half-life of 2.62 hours. Consequently, irradiated silicon wafers should be stored in a cooled and shielded chamber for approximately three days.

Parasitic nuclear conversions may occur. For example,

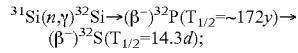

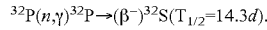

However, this may be neglected for sufficiently short irradiation times. Carbon and oxygen are not affected by the NTD process and remain as oxygen and carbon in the silicon.

At step 322, after a suitable amount of time in storage (3 days for silicon semiconductor material), each semiconductor wafer should be surveyed to determine if there is any residual radiation. At step 324, after the wafers clear the radiation inspection, any oxide cladding if present may be etched away from each wafer by means of for example hydrogen fluoride. At step 326, the uncladded semiconductor wafers may then be placed in an annealing chamber to repair any radiation-induced crystal damage. The annealing chamber may be a state-of-the-art furnace capable of accommodating large diameter ingots and wafers.

In accordance with various embodiments, a plurality of silicon wafers may be simultaneously irradiated with neutrons in the irradiation chamber. The plurality of silicon wafers may be arranged so that the top and bottom surfaces of each wafer are perpendicular to the direction of neutron flux and the number of wafers is determined so that there is no risk of significant absorption effects. Since the silicon material is irradiated as a wafer in an axial direction rather than as an ingot in a radial direction, the achievable radial homogeneity can be tightly controlled and optimized.

For example, in various embodiments, a silicon wafer having a diameter of about 300 mm or greater may be irradiated with neutrons to obtain a uniform base resistivity in the range from about 100 Ohm/cm to about 1,000 Ohm/cm. In various embodiments, a uniform base resistivity in the range from about 200 Ohm/cm to about 700 Ohm/cm can be obtained. For example, a wafer may have a target base resistivity value selected from the range from about 100 Ohm/cm to about 1,000 Ohm/cm and the uniformity of the actual base resistivity value should be ±8.0% or better. In some embodiments, the uniformity of the base resistivity may be ±3.0% or better. In other embodiments, the uniformity of the base resistivity may be ±1.0% or better. For another example, a wafer may have a target base resistivity value selected from the range from about 200 Ohm/cm to about 700 Ohm/cm and the uniformity (max/min value) of the actual base resistivity value should better than ±8.0%. In other embodiments, the uniformity of the base resistivity may be ±2.5% or better. In other embodiments, the uniformity of the base resistivity may be ±1.0% or better.

To ensure the security and health of the staff, the handling of the semiconductor wafers may be performed completely automatically starting from the beginning of the irradiation until the semiconductor wafers are cleared of radiation.

In the event of an emergency shutdown of the proton beam generator 110, the semiconductor wafers may remain in the irradiation chamber 104 until a re-start occurs. In case the plurality of semiconductor wafers 140 has to be removed, an emergency energy supply of the redundantly configured handling robot should then be provided.

At suitable positions outside the NTD reactor, neutron detectors and gamma ray detectors should be mounted. In the event of an emergency shutdown, it should be possible to temporarily completely close off the site. Alpha particles which may be generated during the longer operation of the site may be guided to a getter target (e.g. paraffin) by means of a magnetic field.

In various embodiments, the cooling water and the semiconductor wafers should not be radioactive after the process and can be used again after filtering (dirt/discontinuities; avoiding the contamination of the wafers for further processing).

In various embodiments, a variety of monitoring or measurement sensors may be mounted in the neutron generation chamber and irradiation chamber for continuous monitoring or for periodic probing. For example, the chambers may include one or more cameras for visual inspection and/or one or more sensors for measuring or monitoring neutron flux (e.g., neutron detectors), temperature (e.g., temperature sensors), or proton flux (e.g., proton detectors).

Figure 3:
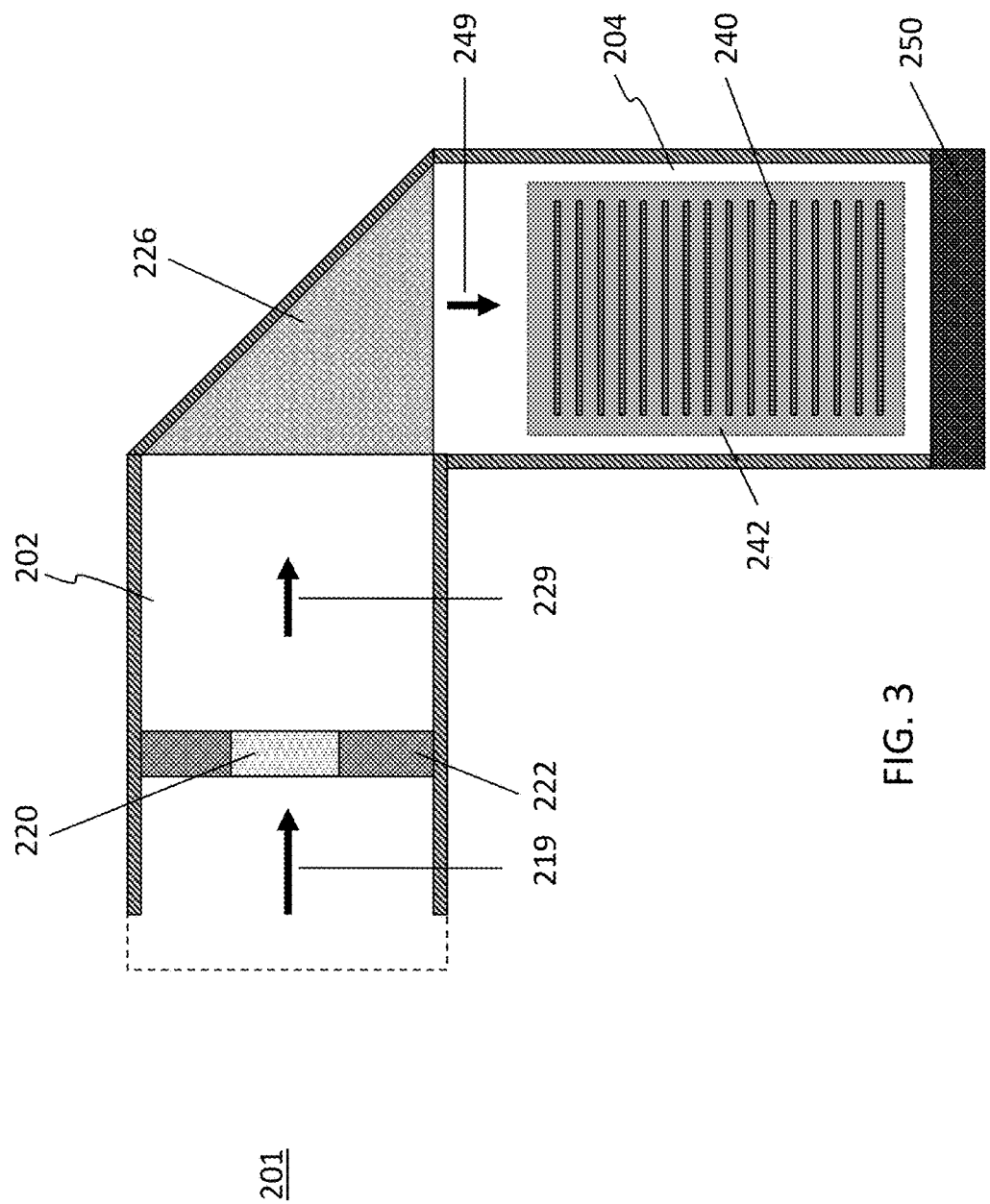
FIG. 3 illustrates a cross-sectional top view of a non-nuclear NTD reactor in accordance with at least one embodiment.

In various embodiments, an NTP reactor may include one proton beam generator and two neutron generation/irradiation chamber assemblies, where each neutron generation/irradiation chamber assembly may be similar to the ones depicted in FIGS. 2 and 3. For example, each neutron generation/irradiation chamber assembly may be positioned next to each other so that the apertures into each of the neutron generation chambers are similarly oriented and a single proton beam generator may be configured to direct proton beams to each of the neutron generation/irradiation chamber assemblies so that at least one irradiation chamber may be irradiated at any time. This configuration allows the loading and unloading of wafers in one of the irradiation chambers without interrupting the proton beam for wafer handling.

In various embodiments, a proton beam may be generated by a laser ion accelerator. For example, the proton beam generator 110 may be a laser directed at a target made of proton producing material. More specifically, a laser producing a beam of high energy short time pulses may be used to irradiate a proton producing material which emits high energy protons thereby generating a proton beam. For example, in various embodiments, the laser ion accelerator may include a petawatt laser that generates a pulse beam having an energy of more than about 100 TW for a duration of more than about 100 femtoseconds and a foil target made of a proton producing metal such as aluminum or gold. The generated ions are accelerated in the direction perpendicular to the target surface. The intensity of the ion beam may be controlled by the duration of the laser pulse and the thickness of the target.

A typical ion or proton implanter operates in a vacuum sealed environment. The vacuum sealed environment should be extended to include the neutron producing target. For example, the neutron producing target may be made of material that is highly reactive to air and should be enclosed in a vacuum sealed environment. The vacuum sealed environment may further be extended to the moderator. For example, the neutron producing target may be mechanically fragile and so the vacuum sealed environment may extend to the moderator which should be a rigid structure.

In various embodiments, a vacuum pump may be positioned between aperture 121 and neutron producing target 120. The vacuum pump removes particles that may interfere with the proton beam generator 110. For example, when a solid lithium target is bombarded by protons, lithium atoms may be sputtered off or secondary reactions creating helium atoms may occur.

In various embodiments, the surface of the neutron moderator may be modified so that the reflection of neutrons back to the neutron source is minimized. For example, surface of the moderating material or its casing should not be polished. A rather rough surface helps in reducing the reflection of neutrons.

In various embodiments, there may be ports in the chamber walls to permit access to the neutron producing target or the neutron moderator or both.

FIG. 5 illustrates a cross-section top view of various embodiments of the non-nuclear NTD reactor 201. Referring to FIG. 5, the non-nuclear NTD reactor 201 is similar to the non-nuclear NTD reactor 101 except that the neutron generation chamber 202 is coupled to the irradiation chamber 204 at about a 90° degree angle. The neutron moderator 226 is further configured to redirect the neutron flow. One surface of the neutron moderator 226 may be configured to include a mirror.

The price of a semiconductor wafer should be significantly lower since the new NTD process provides a very high success rate with relative simplicity. In accordance with various embodiments, it would be possible to achieve a higher wafer quality and homogeneity at comparable costs.

In various embodiments, the plurality of semiconductor wafers may be made of germanium (Ge) or gallium (Ga) or compounds thereof. For example, when natural germanium is irradiated by thermal neutrons gallium-31 can be formed by electron capture and some β-decay according to the following reaction: $^{70}Ge+n \rightarrow ^{71}Ge \rightarrow (EC)^{71}Ga$. Since $^{71}Ga$ is an impurity from group 13 in the periodic table, p type impurity doping is possible by the neutron irradiation of germanium.

In the following, various aspects of this disclosure will be illustrated:

Example 1 is a method of processing one or more semiconductor wafers. The method includes positioning the one or more semiconductor wafers in an irradiation chamber, generating a neutron flux in a spallation chamber coupled to the irradiation chamber, moderating the neutron flux to produce a thermal neutron flux, and exposing the one or more semiconductor wafers to the thermal neutron flux to thereby induce the creation of dopant atoms in the one or more semiconductor wafers.

In Example 2, the subject matter of Example 1 can optionally include that the generating the neutron flux includes generating a proton beam, and directing the proton beam at a neutron producing target to thereby generate the neutron flux.

In Example 3, the subject matter of Example 2 can optionally include that the directing further includes adjusting a space angle between the proton beam and the neutron producing target according to the diameter of the irradiation chamber.

In Example 4, the subject matter of any one of Examples 2 or 3 can optionally include that the generating the proton beam includes directing a laser beam at a proton producing target to thereby generate the proton beam.

In Example 5, the subject matter of any one of Examples 1 to 4 can optionally include that the method further includes arranging the one or more semiconductor wafers in a carrier for positioning in the irradiation chamber, and repositioning the carrier in the irradiation chamber after a first exposure period.

In Example 6, the subject matter of any one of Examples 1 to 5 can optionally include that the method further includes cooling the neutron producing target.

In Example 7, the subject matter of any one of Examples 1 to 6 can optionally include that the method further includes positioning the one or more semiconductor wafers so that the top and bottom surfaces of each semiconductor wafer are perpendicular to the thermal neutron flux.

Example 8 is an apparatus for processing one or more semiconductor wafers. The apparatus includes a spallation chamber, a neutron producing material mounted in the spallation chamber, a neutron moderator mounted in the spallation chamber, and an irradiation chamber coupled to the spallation chamber, the irradiation chamber accommodates one or more semiconductor wafers.

In Example 9, the subject matter of Example 8 can optionally include that the neutron producing material includes or essentially consists of lithium, lithium/carbon mixture, tungsten, boron, and/or boron compounds.

In Example 10, the subject matter of any one of Examples 8 or 9 can optionally include that the apparatus further includes an adjustable mount. The neutron producing material is mounted on the adjustable mount.

In Example 11, the subject matter of any one of Examples 8 to 10 can optionally include that the apparatus further includes a proton beam generator directed at the neutron producing material.

In Example 12, the subject matter of Example 11 can optionally include that the proton beam generator is a proton implanter.

In Example 13, the subject matter of any one of Examples 11 or 12 can optionally include that the proton beam generator includes a proton producing material, and a laser generator directed at the proton producing material. The laser generator is configured to output a laser beam.

In Example 14, the subject matter of any one of Examples 11 to 13 can optionally include that the apparatus further includes a vacuum pump disposed adjacent to a surface of the neutron producing material that faces the proton beam generator.

In Example 15, the subject matter of any one of Examples 8 to 14 can optionally include that the apparatus further includes a cooling unit coupled to the neutron producing material.

In Example 16, the subject matter of any one of Examples 8 to 15 can optionally include that the neutron moderator includes or essentially consists of heavy water, carbon, or carbon compounds.

In Example 17, the subject matter of any one of Examples 8 to 16 can optionally include that the irradiation chamber accommodates one or more semiconductor wafers that are axially aligned with the irradiation chamber.

In Example 18, the subject matter of any one of Examples 8 to 17 can optionally include that the apparatus further includes one or more sensors mounted in the irradiation chamber, the one or more sensors configured to monitor neutron flux.

Example 19 is a semiconductor wafer having a diameter of about 300 mm or greater, and a uniform base resistivity in the range from about 100 Ohm/cm to about 1,000 Ohm/cm, wherein the uniformity of the base resistivity is within about ±8% (max/min value).

In Example 20, the subject matter of Example 19 can optionally include that the uniform base resistivity is in the range from about 200 Ohm/cm to about 700 Ohm/cm, wherein the uniformity (max/min value) of the base resistivity is within about ±2.5%.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of processing one or more semiconductor wafers, the method comprising:
    positioning the one or more semiconductor wafers in an irradiation chamber;
    generating a neutron flux in a spallation chamber coupled to the irradiation chamber;
    moderating the neutron flux to produce a thermal neutron flux; and
    exposing the one or more semiconductor wafers to the thermal neutron flux to thereby induce the creation of dopant atoms in the one or more semiconductor wafers,
    wherein the one or more semiconductor wafers comprise a plurality of semiconductor wafers,
    wherein each of the plurality of semiconductor wafers has a first surface and a second surface opposite the first surface,
    wherein the plurality of semiconductor wafers are positioned so that the first and second surfaces of each semiconductor wafer are perpendicular to the thermal neutron flux and the thermal neutron flux flows through the plurality of semiconductor wafers and is incident on the first surface of each of the plurality of semiconductor wafers, and
    wherein the plurality of semiconductor wafers are positioned to be collinear with each other so that a first surface of one semiconductor wafer faces a second surface of another semiconductor wafer.

2. The method of claim 1, wherein the generating the neutron flux comprises:
    generating a proton beam; and
    directing the proton beam at a neutron producing target to thereby generate the neutron flux.

3. The method of claim 2, wherein the generating the proton beam comprises:
    directing a laser beam at a proton producing target to thereby generate the proton beam.

4. The method of claim 2, further comprising:
    cooling the neutron producing target.

5. The method of claim 2, further comprising:
    monitoring the thermal neutron flux in the irradiation chamber.

6. The method of claim 2, further comprising:
    cladding the plurality of semiconductor wafers with an oxide material before exposure to the thermal neutron flux and uncladding the oxide material from the plurality of semiconductor wafers after exposure to the thermal neutron flux.

7. The method of claim 2, further comprising:
    annealing the plurality of semiconductor wafers.

8. The method of claim 2, further comprising:
    removing spallated particles adjacent to a surface of the neutron producing target on which the proton beam is incident.

9. The method of claim 2,
    wherein the proton beam is generated from a particle accelerator.

10. The method of claim 2,
    wherein the neutron producing target comprises lithium, lithium/carbon mixture, tungsten, boron, or boron compounds.

11. The method of claim 2,
    wherein the neutron flux is moderated by heavy water, carbon, or carbon compounds.

12. The method of claim 2,
    wherein each of the plurality of semiconductor wafers has a diameter of about 300 mm or greater.

13. The method of claim 1,
    wherein the irradiation chamber and the spallation chamber each comprise a cylindrical cavity, and
    wherein the plurality of semiconductor wafers are axially aligned with the cylindrical cavity of the irradiation chamber.

14. The method of claim 13,
    wherein the spallation chamber and the irradiation chamber are axially aligned with each other.

15. The method of claim 1, further comprising:
    repositioning the plurality of semiconductor wafers after a first exposure period so that the thermal neutron flux is incident on the second surface of each of the plurality of semiconductor wafers for a second exposure period.

16. The method of claim 15,
    wherein the plurality of semiconductor wafers are arranged on a removable wafer rack in the irradiation chamber, further comprising:
    removing after the first exposure period the removable wafer rack from the irradiation chamber; and
    repositioning the removable wafer rack in the irradiation chamber so that an orientation of the removable wafer rack is reversed for the second exposure period.

17. The method of claim 16,
    wherein the irradiation chamber comprises a single cavity for receiving the plurality of semiconductor wafers and a door for accessing the cavity.

18. The method of claim 1,
    wherein the moderating is performed by a neutron moderator disposed between the spallation chamber and the irradiation chamber so as to partition the spallation chamber and irradiation chamber.

19. The method of claim 18,
wherein the spallation chamber and the irradiation chamber each comprise neutron reflective walls, further comprising:
guiding neutrons of the neutron flux in the spallation chamber towards the irradiation chamber and guiding neutrons of the thermal neutron flux in the irradiation chamber towards the plurality of semiconductor wafers.

\* \* \* \* \*